United States Patent
Bradley

(10) Patent No.: US 9,047,153 B2
(45) Date of Patent: Jun. 2, 2015

(54) SELECTIVE DELAY OF DATA RECEIPT IN STOCHASTIC COMPUTATION

(75) Inventor: William Bradley, Somerville, MA (US)

(73) Assignee: ANALOG DEVICES, INC., Norwood, MA (US)

(\*) Notice: Subject to any disclaimer, the term of this patent is extended or adjusted under 35 U.S.C. 154(b) by 822 days.

(21) Appl. No.: 13/032,511

(22) Filed: Feb. 22, 2011

(65) Prior Publication Data

US 2012/0158986 A1    Jun. 21, 2012

Related U.S. Application Data

(60) Provisional application No. 61/306,880, filed on Feb. 22, 2010.

(51) Int. Cl.
  *G06F 7/00* (2006.01)
  *G06F 7/58* (2006.01)
  *H03M 13/11* (2006.01)

(52) U.S. Cl.
  CPC ............ *G06F 7/588* (2013.01); *H03M 13/1102* (2013.01)

(58) Field of Classification Search
  CPC .......................... H03M 13/1102; G06F 7/588
  USPC .................................. 708/255, 190; 712/220
  See application file for complete search history.

(56) References Cited

U.S. PATENT DOCUMENTS

| | | | |
|---|---|---|---|
| 5,959,871 A | 9/1999 | Pierzchala | |
| 6,185,331 B1 | 2/2001 | Shi | |
| 6,282,559 B1 | 8/2001 | Helfenstein | |
| 6,584,486 B1 | 6/2003 | Helfenstein | |
| 6,744,299 B2 | 6/2004 | Geysen | |

(Continued)

FOREIGN PATENT DOCUMENTS

| | | |
|---|---|---|
| EP | 614157 | 10/1999 |
| WO | WO2009/137227 | 11/2009 |

(Continued)

OTHER PUBLICATIONS

Tehrani, S.S.; Mannor, S.; Gross, W.J., "Fully Parallel Stochastic LDPC Decoders," IEEE Transactions on Signal Processing, vol. 56, No. 11, pp. 5692-5703, Nov. 2008.*

(Continued)

*Primary Examiner* — Boris Gorney
*Assistant Examiner* — Keith Nielsen
(74) *Attorney, Agent, or Firm* — Patent Capital Group

(57) ABSTRACT

Circuitry for stochastic computation includes processing nodes, including a first processing node and a second processing node, each configured to process an outcome stream having a plurality of outcomes, each outcome being in one of a plurality of states, wherein an outcome from said outcome stream is in a particular state with a particular probability; communication links configured to transmit outcome streams between pairs of said processing nodes; and a delay module on each of said communication links, said delay module configured to delay outcome streams traversing said communication link by an assigned delay; wherein said first and second processing nodes are connected by a plurality of data paths, at least one of which comprises a plurality of communication links, each of said data paths causing an aggregate delay to an outcome stream traversing said data path; wherein no two aggregate delays impose the same delay on an outcome stream.

20 Claims, 4 Drawing Sheets

(56) References Cited

U.S. PATENT DOCUMENTS

| | | | |
|---|---|---|---|
| 6,762,624 | B2 | 7/2004 | Lai |
| 6,763,340 | B1 | 7/2004 | Burns |
| 7,071,846 | B2 | 7/2006 | Moerz |
| 7,292,069 | B2 | 11/2007 | Hannah |
| 7,418,468 | B2 | 8/2008 | Winstead |
| 7,669,106 | B1 | 2/2010 | Farjadrad |
| 7,769,798 | B2 | 8/2010 | Banihashemi |
| 8,458,114 | B2 * | 6/2013 | Vigoda et al. ............ 706/52 |
| 2005/0165879 | A1 | 7/2005 | Nikitin |
| 2005/0240647 | A1 | 10/2005 | Banihashemi |
| 2005/0257124 | A1 * | 11/2005 | Richardson et al. ......... 714/796 |
| 2006/0026224 | A1 | 2/2006 | Merkli |
| 2007/0063879 | A1 * | 3/2007 | Moreaux et al. ............ 341/67 |
| 2007/0280261 | A1 * | 12/2007 | Szymanski ............ 370/395.4 |
| 2008/0065573 | A1 | 3/2008 | Macready |
| 2008/0077839 | A1 * | 3/2008 | Gross et al. ............ 714/755 |
| 2008/0174460 | A1 | 7/2008 | Vigoda et al. |
| 2008/0225747 | A1 * | 9/2008 | Bedrosian ............ 370/252 |
| 2008/0294970 | A1 | 11/2008 | Gross |
| 2009/0228238 | A1 | 9/2009 | Mansinghka |
| 2010/0033228 | A1 | 2/2010 | Gershenfeld |
| 2010/0301899 | A1 | 12/2010 | Vigoda |
| 2010/0306150 | A1 | 12/2010 | Reynolds |
| 2010/0306164 | A1 | 12/2010 | Reynolds |

FOREIGN PATENT DOCUMENTS

| | | |
|---|---|---|
| WO | 2010/059256 | 5/2010 |
| WO | WO2010/101941 | 9/2010 |
| WO | WO2010/101944 | 9/2010 |

OTHER PUBLICATIONS

D'Mello, Design Approaches to Field-Programmable Analog Integrated Circuits, Analog Integrated Circuits and Signal Processing, 17(1-2), 1998.

Eguchi, Simple Design of a Discrete-Time Chaos Circuit Realizing a Tent Map, IEICE Trans. Electron. vol. E83-C(5), May 2000.

Gross, Stochastic Implementation of LDPC Decoders, Signals, Systems and Thirty-Ninth Asilomar Conference 2005.

Hagenauer, A Circuit-Based Interpretation of Analog MAP Decoding with Binary Trellises, Proc. 3rd ITG Conference Source and Channel Coding, Munchen, 2000.

Hagenauer, Analog Decoders and Receivers for High Speed Applications, Proc. of 2002 Int. Zurich Sem. on Broadband Comm, 2002.

Haley, An Analog LDPC Codec Core, Proc. Int. Symp. on Turbo Codes and Related Topics, 2003.

Loeliger, Decoding in Analog VLSI, IEEE Communications Magazine, pp. 99-101, Apr. 1999.

Loeliger, Probability Propagation and Decoding in Analog VLSI, IEEE Transactions on Information Theory, 2001.

Loeliger, Analog Decoding and Beyond, ITW2001, 2pgs., Sep. 2001

Luckenbill, Building Bayesian Networks with Analog Subthreshold CMOS Circuits, Yale University, 2002.

Lustenberger, On the Design of Analog VLSI Iterative Decoders, ETH No. 13879, Zurich, 2000.

Mansinghka, Stochastic Digital Circuits for Probabilistic Inference, MIT, Cambridge, Nov. 2008.

Mansinghka, Natively Probabilistic Computation, MIT Ph.D. 2009.

Nguyen, A 0.8V CMOS Analog Decoder for an (8,4,4) Extended Hamming Code, Proceedings of the 2004 International Symposium on Circuits and Systems, 2004.

Rapley, Stochastic Iterative Decoding on Factor Graphs, Proc. 3rd Int. Symp. on Turbo Codes and Related Topics, pp. 507-510, 2003.

Schaefer, Analog Rotating Ring Decoder for an LDPC Convolutional Code, ITW2003, Paris, France, Mar. 31-Apr. 4, 2003.

Sequin, Analogue 16-QAM demodulator, Electronics Letters vol. 40, No. 18, 2004.

Stan, Analog Turbo Decoder Implemented in SiGe BiCMOS Technology, U. of Virginia, Dec. 15, 2002.

Tehrani, Stochastic Decoding of LDPC Codes, IEEE Communications Letters 10(10) Oct. 2006.

Vigoda, A Nonlinear Dynamic System for Spread Spectrum Code Acquisition, MIT M.S. Thesis, Aug. 1999.

Vigoda, Analog Logic: Continuous-Time Analog Circuit for Statistical Signal Processing, MIT Ph. D. Thesis, Sep. 2003.

Vigoda, Synchronization of Pseudorandom Signals by Forward-Only Message Passing With Application to Electronic Circuits, IEEE Trans. Info. Theory, Aug. 2006.

Winstead, Analog MAP Decoder for (8,4) Hamming Code in Sub-threshold CMOS, ISIT 2001.

Winstead, Analog Iterative Error Control Decoders, U. Alberta, Ph.D. Thesis, 2005.

Winstead, Analog Soft Decoding for Multi-Level Memories, Proc. IEEE Int. Symp. On Multiple-Value Logic (ISMVL'05).

Winstead, Stochastic Iterative Decoders, International Symposium on Information Theory 2005.

* cited by examiner

SELECTIVE DELAY OF DATA RECEIPT IN STOCHASTIC COMPUTATION

CROSS REFERENCE TO RELATED APPLICATIONS

This application claims the benefit of U.S. Provisional Application No. 61/306,880, titled "SELECTIVE DELAY OF DATA RECEIPT IN STOCHASTIC COMPUTATION," filed on Feb. 22, 2010. The contents of which are incorporated herein by reference

STATEMENT AS TO FEDERALLY SPONSORED RESEARCH

This invention was made with government support under contract FA8750-07-C-0231 awarded by the Defense Advanced Research Projects Agency (DARPA). The government has certain rights in the invention.

FIELD OF DISCLOSURE

This disclosure relates to stochastic computers, and in particular, to directing message traffic within stochastic computers.

BACKGROUND

In a stochastic computer, values are represented as a stream of outcomes of a Bernoulli process. In such a computer, each value is represented by the probability of a particular state in the Bernoulli process. For example, a value of "0.7" would be represented by a stream of outcomes in which the probability that a particular outcome is in a first state is 0.7 and the probability that a particular outcome is in a second state is 0.3.

Accordingly, in a stochastic computer, one can estimate the value that is being represented by observing the outcome stream that represents that value. The longer one observes the outcome stream, the more accurate the estimate will be.

The use of outcome streams to represent values offers numerous advantages. For example, to multiply two numbers, a conventional computer would need to carry out a fairly complex procedure. In contrast, to multiply the same two numbers in a stochastic computer, one need only use an "AND" gate to "and" together corresponding bits in the two outcome streams as they arrive.

In a typical stochastic computer, the outcomes of the Bernoulli process are generated by a random number generator. A difficulty that arises, however, is that the numbers generated by a practical random number generator are only pseudo-random. These pseudo-random numbers are random enough for many purposes. However, the lack of true randomness becomes apparent when such random number generators are used in stochastic computers.

For example, since the random number generators can only generate pseudo-random numbers, the string of random numbers will eventually repeat itself. This repetition can cause errors in calculations that rely on the randomness of two incoming outcome streams. In other cases, there may be correlation between what are intended to be two independent outcome streams.

To overcome such difficulties, many stochastic computers use additional random number generators to re-randomize incoming outcome streams. These re-randomizers are analogous to repeaters in communication circuits, except that while repeaters are intended to boost a signal to avoid having it be lost in noise, the re-randomizers are intended to boost the noise to drown out any unwanted signal.

A difficulty that arises with the proliferation of re-randomizers is that each one consumes both additional power and additional floor-space. In a stochastic computer in which messages are being passed simultaneously between hundreds, and possibly thousands of node pairs, the additional power and floor-space required by these re-randomizers becomes considerable.

SUMMARY

In one aspect, the invention features circuitry for stochastic computation. Such circuitry includes a plurality of processing nodes, including a first processing node and a second processing node, each of the processing nodes configured to process an outcome stream having a plurality of outcomes, each of the outcomes in the outcome stream being in one of a plurality of states, wherein an outcome from the outcome stream is in a particular state with a particular probability; communication links configured to transmit outcome streams between pairs of the processing nodes; and a delay module on each of the communication links, the delay module configured to delay outcome streams traversing the communication link by an assigned delay; wherein the first and second processing nodes are connected by a plurality of data paths, at least one of which includes a plurality of communication links, each of the data paths causing an aggregate delay to an outcome stream traversing the data path; wherein no two aggregate delays impose the same delay on an outcome stream.

In some embodiments, at least one delay module has a randomly assigned delay.

In other embodiments, each communication link is assigned a color, each color is assigned a delay, and for all processing nodes, no two communication links to the processing node have the same color.

In yet other embodiments, the plurality of processing nodes and communication links define a sub-graph of a larger graph.

In other embodiments, the delay module is configured to delay an incoming outcome stream by an integer multiple of an interval between adjacent outcomes in the incoming outcome stream.

Among the embodiments include those in which the processing nodes are selected from the group consisting of function nodes and variable nodes, and wherein the communication links are configured such that no two function nodes are connected to each other by a communication link and no two variable nodes are connected to each other by a communication link.

In some embodiments, the processing nodes and the communication links define a bipartite graph.

In other embodiments, the processing nodes are configured to process an outcome stream derived from a Bernoulli process.

In another aspect, the invention features a method of sending an outcome stream between processing nodes in a stochastic computer. Such a method includes transmitting an outcome stream from a first node to a second node along a first communication path; transmitting an outcome stream from a first node to a second node along a second communication path; causing a first aggregate delay in the first communication path; and causing a second aggregate delay in the second communication path, the second aggregate delay being less than the first aggregate delay.

In some practices, causing a second aggregate delay including causing a different between the first and second aggregate delay to be an integer multiple of an interval between adjacent outcomes in the outcome stream.

In other practices, transmitting an outcome stream includes transmitting a stream of outcomes, wherein each outcome assumes a particular state with a particular probability.

In yet other practices, transmitting an outcome stream includes transmitting a stream of outcomes includes simulating a Bernoulli process to generate a stream of outcomes having a predefined probability.

In another aspect, the invention features an article of manufacture having encoded thereon software for executing a stochastic computer, the software including instructions that, when executed by a computer, cause the computer to: define a plurality of processing nodes, including a first processing node and a second processing node, each of the processing nodes configured to process an outcome stream having a plurality of outcomes, each of the outcomes in the outcome stream being in one of a plurality of states, wherein an outcome from the outcome stream is in a particular state with a particular probability; define communication links configured to transmit outcome streams between pairs of the processing nodes; and to assign a delay to each of the communication links for delaying outcome streams traversing the communication link; wherein the first and second processing nodes are connected by a plurality of data paths, at least one of which includes a plurality of communication links, each of the data paths causing an aggregate delay to an outcome stream traversing the data path; wherein no two aggregate delays impose the same delay on an outcome stream.

DETAILED DESCRIPTION

Figure 1:
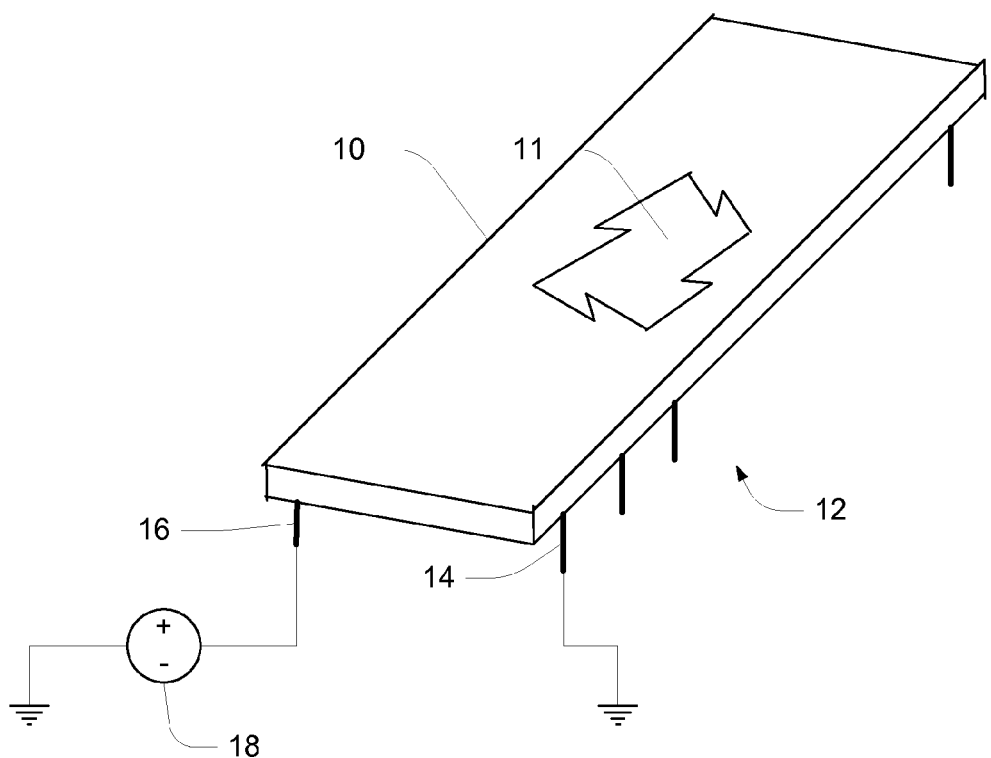
FIG. 1 is a cut-away schematic diagram of an integrated circuit.

FIG. 1 shows a cutaway view of an integrated circuit 10 containing circuitry 11 for implementing a particular stochastic computer to which the methods described herein are tied. The integrated circuit 10 features a plurality of pins 12, including a grounding pin 14 connected to ground and a power pin 16 connected to a DC (direct current) power source 18.

Figure 2:
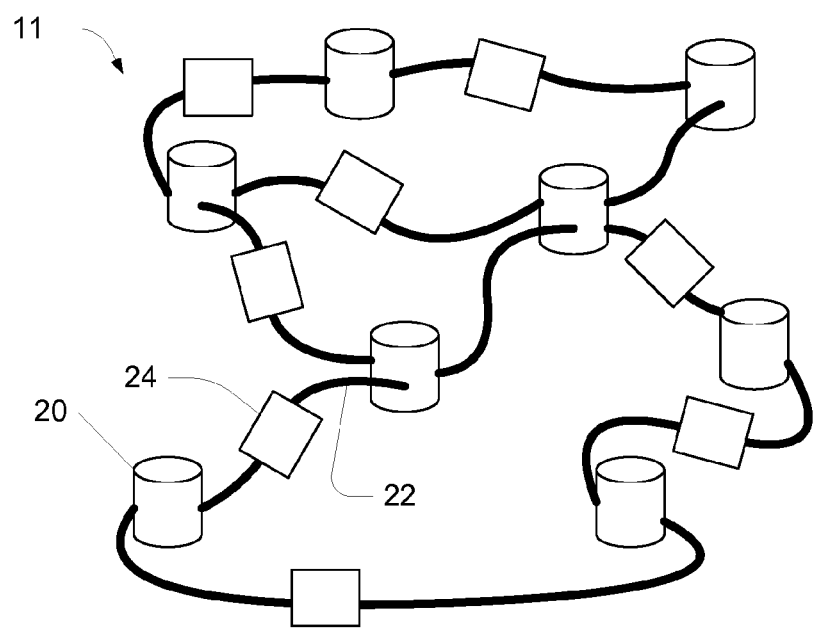
FIG. 2 is a schematic diagram of representative circuitry from the integrated circuit of FIG. 1.

The illustrated circuitry 11, shown in more detail in FIG. 2, includes processing nodes 20 connected to one or more other processing nodes by either unidirectional or bidirectional communication links 22. Each such processing node 20 generates an output that depends on its inputs. The inputs and outputs are stream of outcomes of a Bernoulli process having a probability that represents the value to be represented. A finite segment of such an outcome stream is referred to herein as a "message."

Each communication link 22 includes a delay module 24 that delays the outcome stream traversing that communication link. The extent of the delay at each delay module 24 can be fixed at the time of manufacture. Or the extent of the delay can be programmable at run time.

Figure 3:
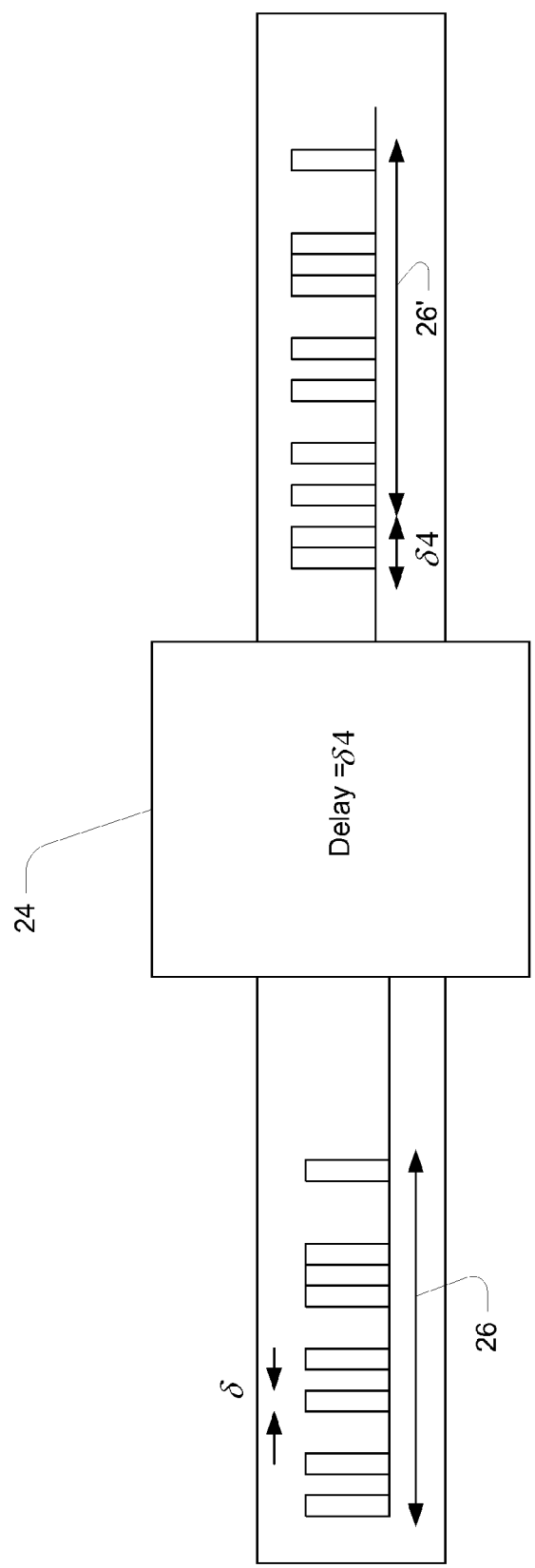
FIG. 3 shows the result of applying a delay to an outcome stream.

FIG. 3 shows an exemplary incoming outcome stream 26 entering a delay module 24. The particular delay module 24 is configured to output an outcome stream 26' that is the same as the incoming outcome stream 26, but delayed by an integer multiple of the interval, $\delta$, between adjacent outcomes. In the illustrated example, the delay is $4\delta$.

Figure 4:
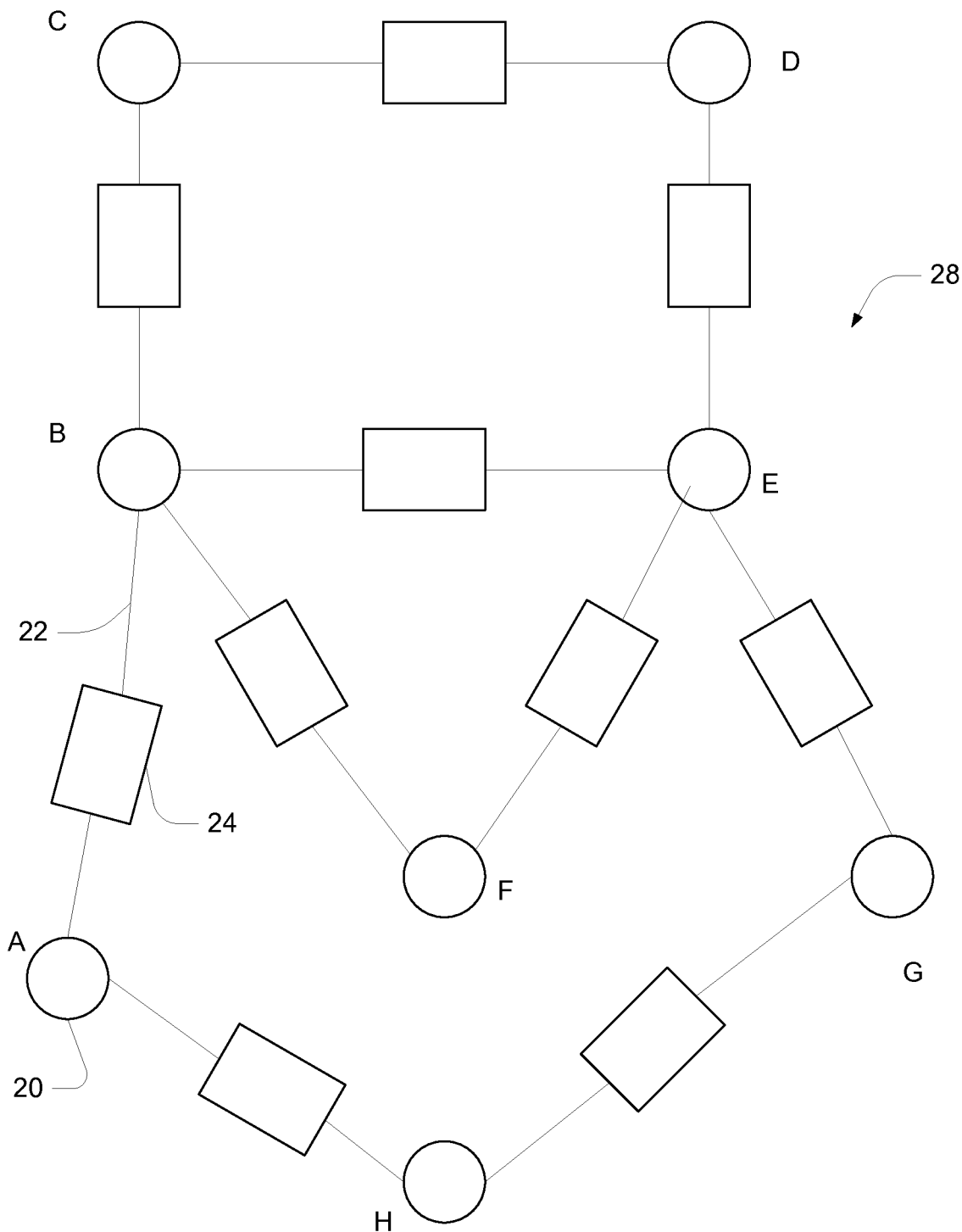
FIG. 4 is a graphical representation of the circuitry from FIG. 2.

For ease of analysis, the circuitry 11 shown in FIG. 2 is more conveniently represented as a circuit diagram, or graph 28, as shown in FIG. 4. In such a graph, edges 22 connect nodes 20 to each other. Each edge 22 has an associated delay 24. Between pairs of nodes 20, there exist multiple message paths, each of which can comprise multiple edges 22 connecting intermediary nodes 20. For each message path, there exists an aggregate delay obtained by adding together the delays 24 for each edge 22 on the message path. For example, in FIG. 4, the paths from node A to H would include the single edge path directly to node H (path AH), as well as paths ABFEGH, ABEGH, and ABCDEGH.

The topology of the graph associated with a particular stochastic computer depends in part on the application of the stochastic computer. For example, when the stochastic computer is intended for decoding, the graph is a bipartite graph 30 such as that shown in FIG. 5. In the bipartite graph 30 shown in FIG. 5, the nodes 20 are either function nodes 32 or variable nodes 34. The variable nodes 34 hold values that are intended to converge to correct values; the function nodes 32 carry out functions to modify the values held in the variable nodes 34 in such a way as to bring those values progressively closer to the correct values. In a graph used for decoding, the function nodes 32 are often XOR nodes.

A difficulty that can arise when pseudo-random number generators are used is that the outcome stream can repeat itself. The period that elapses before the sequence repeats itself is referred to herein as a "PRNG (pseudo-random number generator) cycle length." A message that is shorter than this cycle length is therefore said to be "cycle free." If the computation is not complete before the end of the PRNG cycle length, the algorithmic behavior can be severely compromised.

In general, any first and second processing node 20 can be connected by two or more paths, each of which comprises one or more edges 22, as discussed above in connection with FIG. 4. To reduce the probability of error in a stochastic computer, it is useful to reduce the extent to which outcome streams traversing these different paths between the first and second nodes are correlated with each other. The correlation between outcome streams traversing different paths can be controlled by delaying the outcome streams by different amounts. It is for this purpose that delay modules 24 are placed on each communication link 22.

In general, the extent to which outcome streams from a first node to a second node are correlated can be reduced by ensuring that the no two paths between the first and second nodes have the same aggregate delay. This, in the context of FIG. 4., the paths ABFEGH, ABEGH, ABCDEGH, and AH would all have different aggregate delays. The same can be said for all paths connecting any pair of nodes in FIG. 4.

The choice of how much delay should be imparted by a particular delay module 24 is subject to the constraint that for any pair of nodes, no two paths between those nodes have the same aggregate delay. For relatively simple graphs, suitable delays can be derived by inspection. For more complex graphs, delays can be assigned randomly across each edge. In such a case, the delays can be selected from a uniform distribution.

Although the probabilistic method of assigning delays is convenient to use, and although it represents an improvement over the case in which each edge has the same delay, it is not guaranteed to ensure that the foregoing constraint is met. For example, there exists a small probability, when using the probabilistic method, that the delays on each edge will be the same. This would result in no decrease in correlation between outcome streams traversing different paths.

Another approach to assigning delays to edges is to do so indirectly by assign colors to edges in such a way that all edges that connect to a particular node have different colors. Then, one would assign a particular delay to each color.

Figure 5:
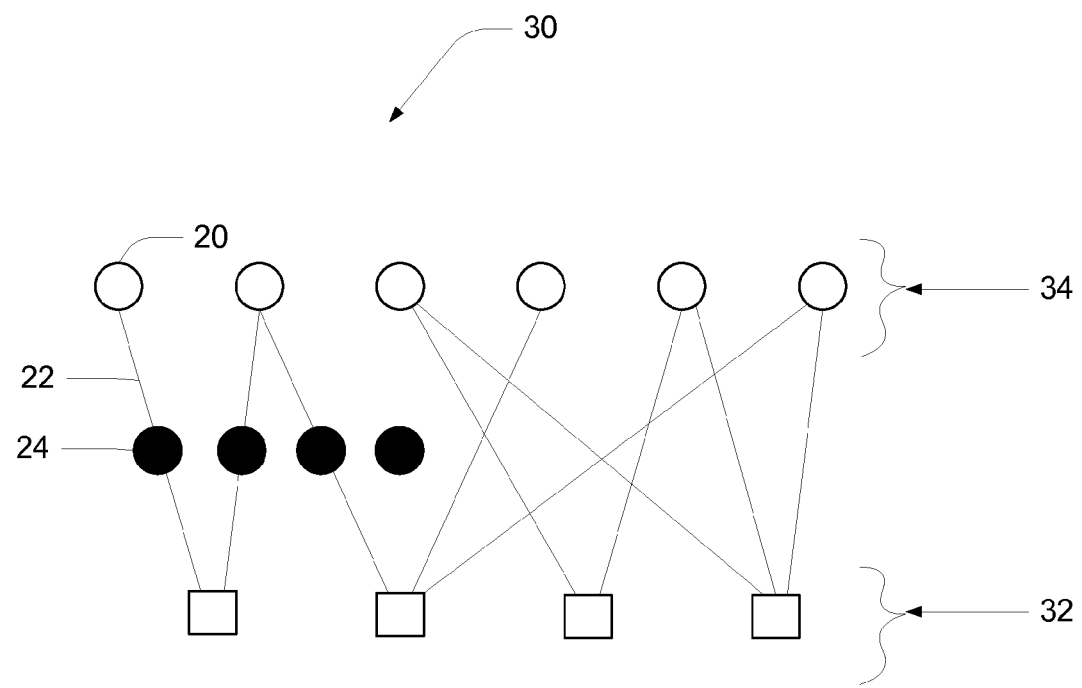
FIG. 5 is a bipartite graph showing a sub graph with delay lines.

In practice, delay values need only be assigned to edges within a sub-graph of a larger graph, as shown in FIG. 5. The extent of a sub-graph is typically defined by a graph depth. For example, a sub-graph may be defined by the set of all nodes that can be reached from a particular node by traversing at most m edges.

As described here, the processing nodes 20, communication links 22, and delay modules 24 are implemented on an application specific integrated circuit. However, they can also be implemented in any hardware, for example on a FPGA, or on a general purpose digital computer executing suitable software.

Having described the invention, and a preferred embodiment thereof, what I claim as new, and secured by letters patent is:

1. An integrated circuit for stochastic computation, said integrated circuit comprising:
   circuitry forming a plurality of processing nodes, including a first processing node and a second processing node, each of said processing nodes configured to process an outcome stream having a plurality of outcomes, each of said plurality of outcomes in said outcome stream being in one of a plurality of states, wherein an outcome from said outcome stream is in a particular state with a particular probability;
   circuitry forming communication links configured to transmit outcome streams between pairs of said plurality of processing nodes; and
   circuitry forming a delay module on each of said communication links, said delay module configured to delay outcome streams traversing said communication link by an assigned delay;
   wherein said first and second processing nodes are connected by a plurality of data paths, at least one of which comprises a plurality of communication links, each of said data paths connecting the first and second processing nodes and causing an aggregate delay to an outcome stream traversing said data path;
   wherein the assigned delays of the communication links traversed by each of said data paths connecting the first and second processing nodes are selected subject to the constraint that no two aggregate delays impose the same delay on an outcome stream.

2. The integrated circuit of claim 1, wherein the assigned delays of the communication links traversed by each of said data paths connecting the first and second processing nodes are selected to reduce the extent to which outcome streams traversing the plurality of data paths between the first and second processing nodes are correlated with each other.

3. The integrated circuit of claim 1, wherein each communication link of the plurality of communication links is assigned a color, each color is assigned a delay, and for all processing nodes, no two communication links to said processing node have the same color.

4. The integrated circuit of claim 1, wherein said plurality of processing nodes and communication links define a sub-graph of a larger graph.

5. The integrated circuit of claim 1, wherein said delay module is configured to delay an incoming outcome stream by an integer multiple of an interval between adjacent outcomes in said incoming outcome stream.

6. The integrated circuit of claim 1, wherein processing nodes of said plurality of processing nodes are selected from a group consisting of function nodes and variable nodes, and wherein said plurality of communication links are configured such that no two function nodes are connected to each other by a communication link and no two variable nodes are connected to each other by a communication link.

7. The integrated circuit of claim 1, wherein said plurality of processing nodes and said communication links define a bipartite graph.

8. The integrated circuit of claim 1, wherein said plurality of processing nodes are configured to process an outcome stream derived from a Bernoulli process.

9. An article of manufacture having encoded thereon software for executing a stochastic computer, said software comprising instructions that, when executed by a computer, cause the computer to:
   define a plurality of processing nodes, including a first processing node and a second processing node, each of said processing nodes configured to process an outcome stream having a plurality of outcomes, each of said plurality of outcomes in said outcome stream being in one of a plurality of states, wherein an outcome from said outcome stream is in a particular state with a particular probability;
   define communication links configured to transmit outcome streams between pairs of said processing nodes; and to
   wherein said first and second processing nodes are connected by a plurality of data paths, at least one of which comprises a plurality of communication links, each of said data paths connecting the first and second processing nodes and causing an aggregate delay to an outcome stream traversing said data path;
   select and assign a delay to each of said communication links for delaying outcome streams traversing said communication link subject to the constraint that no two aggregate delays impose the same delay on an outcome stream.

10. The article of claim 9, wherein each communication link of the plurality of communication links is assigned a color, each color is assigned a delay, and for all processing nodes, no two communication links to said processing node have the same color.

11. The article of claim 9, wherein selecting the delays comprises selecting the delays to reduce the extent to which outcome streams traversing the plurality of data paths between the first and second processing nodes are correlated with each other.

12. The article of claim 9, wherein said plurality of processing nodes and communication links define a sub-graph of a larger graph.

13. The article of claim 9, wherein said delay module is configured to delay an incoming outcome stream by an integer multiple of an interval between adjacent outcomes in said incoming outcome stream.

14. The article of claim 9, wherein processing nodes of said plurality of processing nodes are selected from a group consisting of function nodes and variable nodes, and wherein said plurality of communication links are configured such that no two function nodes are connected to each other by a communication link and no two variable nodes are connected to each other by a communication link.

15. The article of claim 9, wherein said plurality of processing nodes and said communication links define a bipartite graph.

16. The article of claim 9, wherein said plurality of processing nodes are configured to process an outcome stream derived from a Bernoulli process.

17. An integrated circuit for stochastic computation, said integrated circuit comprising:
   circuitry forming a plurality of processing nodes, including a first processing node and a second processing node, each of said processing nodes configured to process an outcome stream having a plurality of outcomes, each of said plurality of outcomes in said outcome stream being in one of a plurality of states, wherein an outcome from said outcome stream is in a particular state with a particular probability;
   circuitry forming communication links configured to transmit outcome streams between pairs of said plurality of processing nodes; and
   circuitry forming a delay module on each of said communication links, said delay module configured to delay outcome streams traversing said communication link by an assigned delay;
   wherein said first and second processing nodes are connected by a plurality of data paths, at least one of which comprises a plurality of communication links, each of said data paths connecting the first and second processing nodes and causing an aggregate delay to an outcome stream traversing said data path; and
   wherein no two aggregate delays impose the same delay on an outcome stream, and at least one delay module has a randomly assigned delay.

18. The integrated circuit of claim 17, wherein the assigned delays of the communication links traversed by each of said data paths connecting the first and second processing nodes are selected to reduce the extent to which outcome streams traversing the plurality of data paths between the first and second processing nodes are correlated with each other.

19. The integrated circuit of claim 17, wherein said plurality of processing nodes and communication links define a sub-graph of a larger graph.

20. The integrated circuit of claim 17, wherein said delay module is configured to delay an incoming outcome stream by an integer multiple of an interval between adjacent outcomes in said incoming outcome stream.

* * * * *